US007952841B2

(12) United States Patent
Mayerl et al.

(10) Patent No.: US 7,952,841 B2

(45) Date of Patent: May 31, 2011

(54) DEVICE FOR DETECTING MALFUNCTIONS BY MANIPULATION OF AN INTERNAL VOLTAGE SUPPLY

(75) Inventors: Christoph Mayerl, Munich (DE); Uwe Weder, Au (DE)

(73) Assignee: Infineon Technologies AG (DE)

( * ) Notice: Subject to any disclaimer, the term of this patent is extended or adjusted under 35 U.S.C. 154(b) by 525 days.

(21) Appl. No.: 11/560,804

(22) Filed: Nov. 16, 2006

(65) Prior Publication Data

US 2008/0106427 A1 May 8, 2008

(30) Foreign Application Priority Data

Nov. 2, 2006 (DE) ......................... 10 2006 051 768

(51) Int. Cl.

| | |
|---|---|
| ***H02H 7/00*** | (2006.01) |
| ***H02H 9/00*** | (2006.01) |
| *G01R 25/00* | (2006.01) |
| *H03D 13/00* | (2006.01) |
| *H03K 3/00* | (2006.01) |

(52) U.S. Cl. ............................... 361/18; 327/7; 327/277

(58) Field of Classification Search ..................... 361/18
See application file for complete search history.

(56) References Cited

U.S. PATENT DOCUMENTS

| | | | | |
|---|---|---|---|---|
| 4,746,879 | A * | 5/1988 | Ma et al. | 331/44 |
| 4,859,872 | A * | 8/1989 | Hyakutake | 327/74 |
| 5,856,751 | A | 1/1999 | Gleim et al. | |
| 6,366,154 | B2 * | 4/2002 | Pulvirenti | 327/525 |
| 6,778,033 | B2 * | 8/2004 | Wong et al. | 331/185 |
| 6,803,832 | B2 * | 10/2004 | Pigott | 331/143 |
| 7,280,000 | B2 * | 10/2007 | Daniel | 331/143 |
| 7,397,678 | B2 * | 7/2008 | Frank et al. | 363/89 |
| 7,414,450 | B2 * | 8/2008 | Luo et al. | 327/277 |
| 2002/0135339 | A1 | 9/2002 | Tang et al. | |
| 2006/0192681 | A1 | 8/2006 | Haider et al. | |

FOREIGN PATENT DOCUMENTS

| | | |
|---|---|---|
| DE | 103 27 285 A1 | 1/2005 |
| EP | 0 589 374 | 3/1994 |

* cited by examiner

*Primary Examiner* — Jared Fureman
*Assistant Examiner* — Lucy Thomas
(74) *Attorney, Agent, or Firm* — Dickstein Shapiro LLP

(57) ABSTRACT

A device for determining an interference with a regulated voltage provided by a control loop with a unit for monitoring a control variable of the control loop and a unit for generating a notification signal if the control variable or a change in the time of the control variable is beyond a tolerance range around a normal value.

15 Claims, 3 Drawing Sheets

DEVICE FOR DETECTING MALFUNCTIONS BY MANIPULATION OF AN INTERNAL VOLTAGE SUPPLY

CROSS-REFERENCE TO RELATED APPLICATIONS

Figure 1:
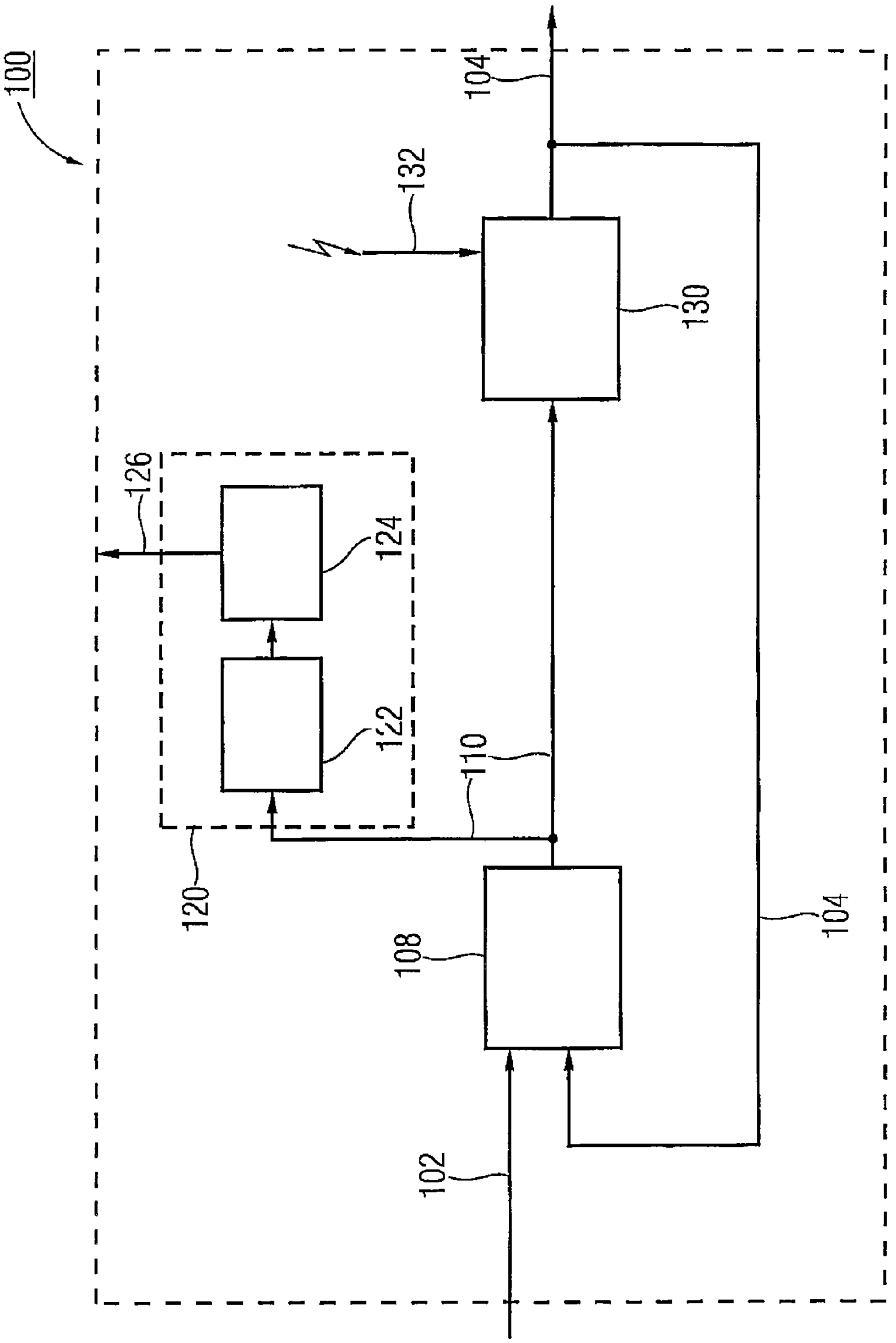

This application claims priority from German Patent Application No. 10 2006 051 768.7, which was filed on Nov. 2, 2006, and is incorporated herein by reference in its entirety.

BACKGROUND

The present invention relates to the concept of determining an interference with a regulated voltage provided by a control loop, such as it may particularly be used to avoid loss of security-relevant data.

In electronic circuits, there are generally needed various stable voltages. In order to be able to provide these different voltage levels, voltage regulators are used, among other things. By exposing metal traces of an internal voltage supply network of an electronic circuit by preparation and subsequent contacting with the aid of a so-called probe needle and a so-called spike generator, interferences in the form of voltage peaks and/or spikes may be induced on an internal regulated voltage of the electronic circuit. Voltage peaks on the internal regulated voltage may, for example, result in malfunctions of a system linked to the electronic circuit, which may result in loosing security-relevant data. For example, in the field of cryptography, faulty results of an encryption algorithm due to outside influences, potentially in comparison with a correct result, may reveal security-relevant keys.

Contacting the internal voltage supply of an electronic circuit with a probe needle during a spike attack on a system requires impressing a DC voltage $V_{probe}$ corresponding to the internal regulated voltage VDDint. As an attacker generally does not exactly achieve the voltage level VDDint of the internal regulated voltage with the impressed DC voltage $V_{probe}$, an intervention takes place into a control system of the internal voltage regulator, which then reacts with a permanent actual value>target value and/or actual value<target value.

Effects of an induced voltage peak on an internal regulated supply voltage may be detected by, for example, comparing two voltages derived from an external supply voltage of the electronic circuit. For this purpose, a voltage is, for example, influenced by capacitive launching of voltage peaks of the internal regulated supply voltage. With this procedure, however, an unambiguous distinction between legitimate load changes caused by the system and actually induced spikes is very hard to achieve and/or may only be realized with a large safe distance. This results in a dependence of the sensitivity of a voltage peak detector on an internal chip capacitance, a floor plan and the application.

BRIEF SUMMARY

According to embodiments, the present invention provides a device for determining an interference with a regulated voltage provided by a control loop with a monitor for monitoring a control variable or a change in time of the control variable of the control loop and a generator for generating a notification signal if the control variable or the change in time is beyond a tolerance range around a normal value.

Thus, embodiments of the invention have the advantage that a spike attack on an electronic circuit may be very reliably detected by monitoring a control variable of the voltage control loop. The spike attack is detected by observing the control mechanism and not by observing the effect on the internal regulated voltage. Thus, error-provoking attacks that may result in the loss of security-relevant data may be detected more easily and reliably, and thus protection mechanisms may be triggered to prevent the loss of data.

BRIEF DESCRIPTION OF THE SEVERAL VIEWS OF THE DRAWING(S)

Figure 2:
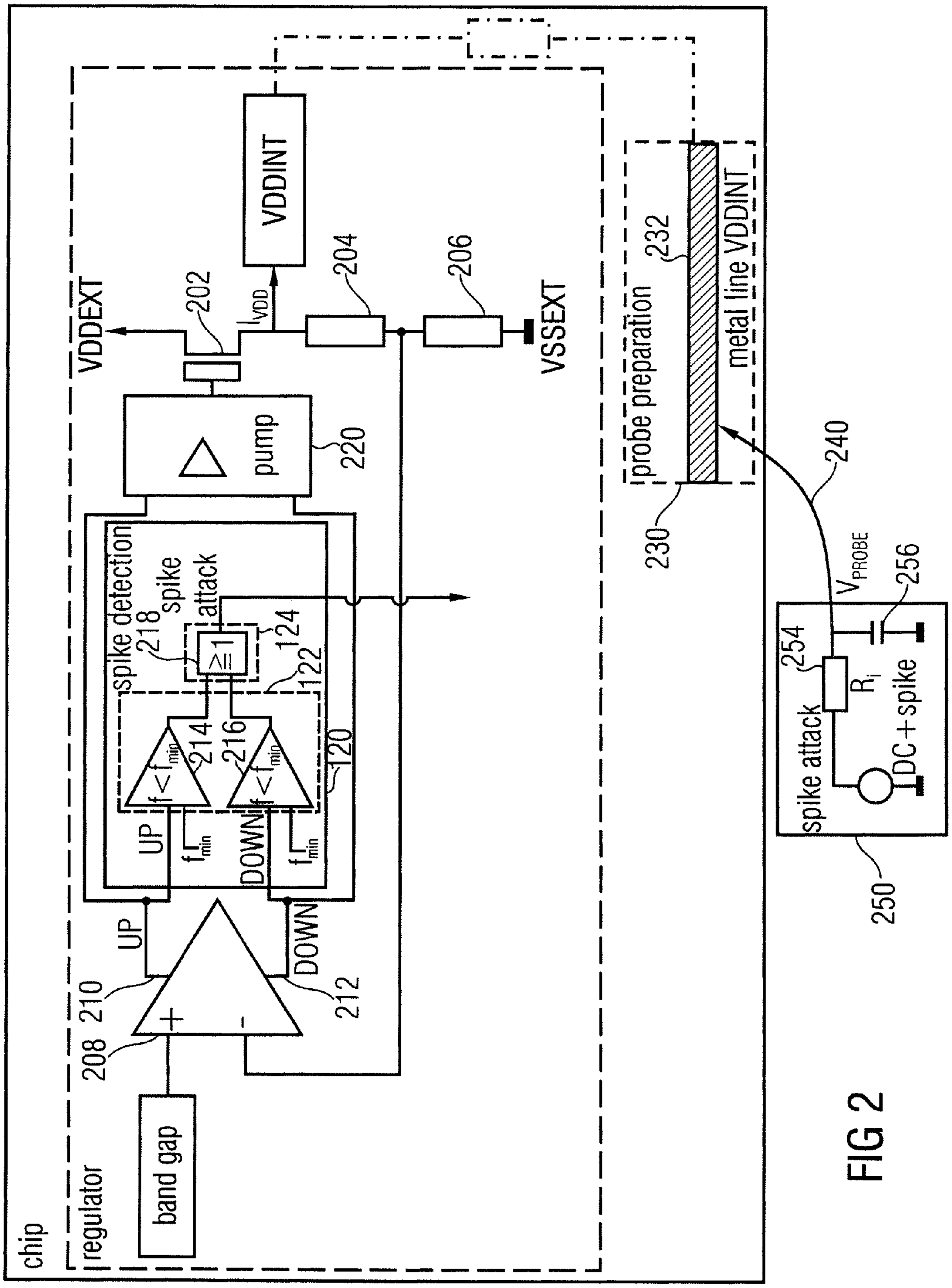
Figure 3:
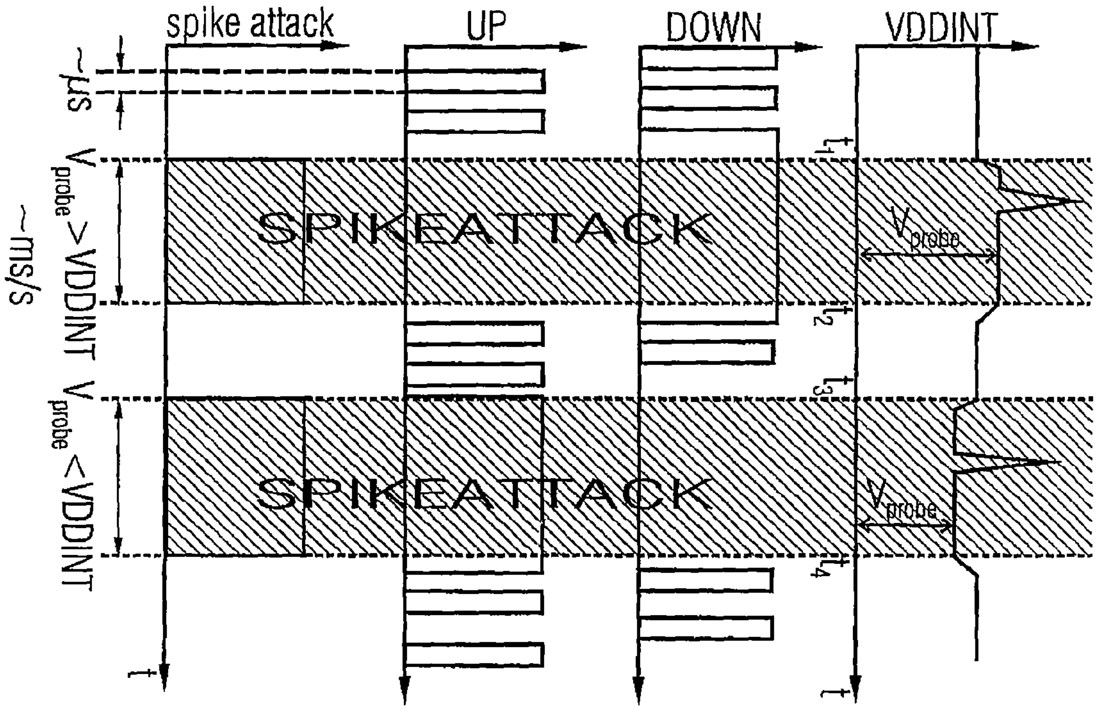

Preferred embodiments of the present invention will be explained in more detail below with reference to the accompanying drawings, in which:

FIG. 1 shows a schematic block diagram of a control loop with a device for determining an interference with a controlled variable provided by the control loop according to an embodiment of the present invention;

FIG. 2 shows a block diagram of a circuit for providing a regulated voltage with a device for determining an interference with the regulated voltage provided by the control loop according to an embodiment of the present invention; and FIG. 3 shows a schematic representation of a timing of a spike attack with an impressed DC voltage $V_{probe}$<VDDint and $V_{probe}$>VDDint and the corresponding behavior in time of the control variables of the control loop.

DETAILED DESCRIPTION

With respect to the following description, it is to be noted that, in the various embodiments, equal functional elements or elements acting equally have the same reference numerals, and thus the descriptions of these functional elements in the various embodiments illustrated below are interchangeable.

FIG. 1 shows a schematic block diagram of a control loop 100 at the input of which a reference variable and/or a target value 102 is present. An output of the control loop 100 is formed by a controlled variable and/or an actual value 104. The controlled variable 104 is compared to the reference variable 102 in a comparing means and/or a comparator 108, thus effecting a control variable 110 at the output of the comparator 108. The control variable 110 constitutes an input of an inventive device 120 for determining an interference with the controlled variable 104 provided by the control loop 100 with means 122 for monitoring the control variable 110 of the control loop 100 and means 124 for generating a notification signal 126 if the control variable 110 or a parameter of the control variable 110, for example a change in time thereof, is beyond a tolerance range around a normal value. Furthermore, the control variable 110 constitutes an input of a controlled system 130 to control the controlled system 130 and/or a control element of the controlled system 130 in a suitable way. A further input of the controlled system 130 is formed by a disturbance variable 132. At an output, the controlled system 130 provides the controlled variable and/or the actual value 104.

What may be regarded as control variable 110 is any signal occurring in the control loop 100 having an influence on a control element of the controlled system 130, wherein the control element outputs the variable 104 to be regulated.

An attack on the control loop 100 is modeled by the disturbance variable 132. According to the invention, the attack is now detected by observing the control mechanism and/or by observing the control variable 110. According to the present invention, the controlled variable and/or the actual value 104 is a voltage regulated by the control loop 100.

The comparator 108 compares the reference variable 102 and the controlled variable 104 and, depending thereon, outputs a signal at its output as control variable 110. According to an embodiment of the present invention, the comparator 108 has a differential amplifier. According to embodiments, the controlled system 130 comprises a charge pump and a regulation transistor as control elements. Depending on the reference variable 102 and the controlled variable 104, the differential amplifier outputs at least one control signal to either reduce or increase a VCO frequency (VCO=voltage controlled oscillator) of the charge pump, wherein the VCO frequency, in turn, controls a control voltage for the regulation transistor. According to an embodiment of the present invention, the means 122 for monitoring monitors a change in time and/or a frequency of the at least one control signal and/or the control variable and causes the means 124 for generating a notification signal 126 to generate a notification signal if the frequency of the at least one control variable is beyond a tolerance range around a normal value, particularly below a lower cut-off frequency.

According to a further embodiment of the present invention, the control voltage of the regulation transistor provided by a charge pump following the differential amplifier may be regarded as control variable. According to this embodiment of the present invention, the means for monitoring monitors the control voltage and/or the control variable itself and causes the means for generating a notification signal to generate a notification signal if the control variable itself is beyond a tolerance range around a normal value.

According to a further embodiment of the present invention, a differential amplifier included in the comparing means 108 directly provides a control voltage at its output as control variable 110 for a regulation transistor included in the controlled system 130 to allow providing a regulated voltage. According to this embodiment of the present invention, the means 122 for monitoring monitors the control voltage and/or the control variable 110 itself and causes the means 124 for generating a notification signal 126 to generate a notification signal if the control variable 110 itself is beyond a tolerance range around a normal value.

By monitoring the control variable 110 and/or a change in time of the control variable 110 of the control loop 100, a conclusion is thus drawn as to the state of the control loop 100 and a determination is thus made whether a system supplied by the voltage 104 internally regulated by the control loop 100 is supplied externally via a probe needle. According to an embodiment of the present invention, the means 122 for monitoring the control variable 110 may include a digital counter for this purpose to allow determining, for example, a frequency of the control variable 110. This makes an observation of the internal regulated voltage and/or the controlled variable 104 itself superfluous, thus providing independence of an evaluation of a change of the internal supply voltage and/or the controlled variable 104.

A preferred embodiment of a device for determining an interference with a regulated voltage provided by a control loop according to an embodiment of the present invention will be explained in more detail below with reference to FIG. 2.

FIG. 2 shows a schematic representation of an IC (integrated circuit) and/or a chip 200 comprising a control loop 100 for regulating an internal regulated voltage VDDint. The control loop 100 comprises an NMOS transistor 202, whose drain terminal is connected to an external supply voltage VDDext. The internal regulated voltage VDDint is present at a source terminal of the NMOS transistor 202. Furthermore, the source terminal of the NMOS transistor 202 is connected to a first terminal of a resistor 204 whose second terminal is connected to a first terminal of a second resistor 206, whose second terminal is at a reference potential VSSext. The control loop 100 comprises a differential amplifier 208 with a first input and with a second input.

At the first input of the differential amplifier 208, there is a stable reference voltage that may, for example, be supplied by a so-called band gap circuit. A part of the regulated internal voltage VDDint divided by the voltage divider consisting of the two resistors 204 and 206 is fed back to the second input of the differential amplifier 208. The differential amplifier 208 further comprises a first and a second output, wherein an up signal 210 is provided at the first output and a down signal 212 is provided at the second output of the differential amplifier 208. The two outputs of the differential amplifier 208 with the up signal 210 and the down signal 212 constitute a first and a second input of an inventive device 120 for determining an interference with the regulated voltage VDDint provided by the control loop 100.

In the device 120, the up signal 210 and the down signal 212 are supplied to means 122 for monitoring the two signals. The means 122 for monitoring comprises a first comparator 214 for the up signal 210 and a second comparator 216 for the down signal 212. An output of the first comparator 214 and an output of the second comparator 216 respectively form an input for means 124 for generating a notification signal 126. In the embodiment of the present invention illustrated in FIG. 2, the means 124 for generating the notification signal 126 includes an OR gate 218. The up signal 210 present at the first output of the differential amplifier 208 is further coupled to a first input of a charge pump 220. The down signal 212 present at the second output of the differential amplifier 208 is coupled to a second input of the charge pump 220. An output of the charge pump 220 is connected to the control and/or gate terminal of the NMOS transistor 202.

The reference numeral 230 denotes an area on the chip and/or IC 200 in which the internal regulated supply voltage VDDint is made accessible, for example by exposing a metal trace of an internal supply network of the chip 200. The reference numeral 240 indicates a probe needle of a spike generator 250, with which disturbances of the internal regulated supply voltage VDDint are to be induced. In FIG. 2, the spike generator 250 is illustrated by an equivalent circuit diagram including a voltage source 252, an internal resistor 254 and a capacitance 256.

For a spike attack on the internal regulated voltage VDDint, a constant voltage supply $V_{probe}$ in the range of the regulated voltage VDDint by means of the spike generator 250 is required. This is schematically illustrated in the upper part of FIG. 3.

The upper part of FIG. 3 shows the internal regulated voltage VDDint plotted versus time, wherein the regulated voltage VDDint is subjected to two spike attacks sequential in time. In a first time period $t_1$, to $t_2$, a constant voltage supply $V_{probe}$ is applied via the exposed metal trace 232, wherein $V_{probe}$ is slightly higher than the voltage VDDint. Conversely, in a period from $t_3$ to $t_4$, a voltage $V_{probe}$ is applied to the exposed metal trace 232, wherein here $V_{probe}$ is slightly lower than the voltage VDDint. The difference from $V_{probe}$ to VDDint may be interpreted as disturbance variable 132.

In the first case and/or the first time interval $t_1$ to $t_2$, $V_{probe}$>VDDint, which results in the situation that a larger voltage is present at the inverting input of the differential amplifier 208 than the reference voltage provided by the band gap circuit at the non-inverting input of the differential amplifier 208. Since the differential amplifier 208 wants to keep its inputs always at the same potential, i.e. the reference potential, via the feedback loop, the down signal 212 of the differential amplifier 208 is permanently active and/or the up signal 210 is permanently inactive in the time interval $t_1$ to $t_2$. This relationship is illustrated in the middle of FIG. 3. Conversely, in the case $V_{probe}$<VDDint and/or in the second time interval $t_3$ to $t_4$, the up signal 210 of the differential amplifier 208 is permanently active and/or the down signal 212 is permanently inactive.

In the frequency range of the control variable, the activity and/or inactivity of the control signals and/or the control variables 210, 212 means a frequency portion below a minimum cut-off frequency of the control signals, which is not reached with normal regulation behavior of the control loop 100. With the first comparator 214 and the second comparator 216, the frequency of the up signal 210 and/or the down signal 212, respectively, may now be compared to a lower cut-off frequency $f_{min}$ that may respectively be tolerated. In the case of a frequency below the lower cut-off frequency $f_{min}$, the two comparators 214 and 216 respectively output a logical one at their outputs, wherein the two outputs constitute the inputs of the OR gate 218. This is schematically illustrated in the lower part of FIG. 3. If a logical one is present at the output of the OR gate 218, this means that one of the two control variables 210 and/or 212 has fallen below the lower cut-off frequency $f_{min}$, and thus a spike attack on the internal regulated voltage VDDint.

Both scenarios $V_{probe}$>VDDint and/or $V_{probe}$<VDDint thus mean an intervention in the regulation of the voltage regulator 100 present on the chip and/or IC 200, which regulates the external voltage VDDext to the internal chip supply voltage VDDint with the help of the reference voltage (for example from a band gap circuit) present at the first input of the differential amplifier 208. According to the invention, these attacks are detected as such by the temporal observation of a control variable or the behavior in time of the control variable of the control loop. In the embodiment of the present invention shown in FIG. 2, control variables of the control loop are the signals 210 and 212. Since a duration of such spike attacks schematically shown in FIG. 3 is generally in an order above a time constant of the control loop 100, an attack may be detected by permanent exceeding of and/or falling below the control variable and/or a frequency of the control variable.

Depending on the control architecture, various control variables may be monitored. For a simple p-regulator (proportional regulator), the control and/or gate voltage of the regulation transistor 202 of the controlled system 130 may, for example, be monitored by permanently falling below a minimum voltage or permanently exceeding a maximum voltage. For an n-regulator shown in FIG. 2 having its own charge pump, the VCO frequency (VCO=voltage controlled oscillator) of the charge pump may also be compared to a minimum frequency, for example.

As already described above, both the up signal 210 and the down signal 212 respectively constitute a control variable of the control loop for the control circuit illustrated in FIG. 2. Thus the up and down signals 210 and 212 of the differential amplifier 208 and/or their frequencies are observed for the embodiment of the present invention illustrated in FIG. 2.

Summarizing, the inventive concept thus allows detection of a spike attack by observing a control mechanism. The observation of a lower cut-off frequency of a control variable of the regulation amplifier, which compares the internal voltage VDDint to a reference voltage, allows conclusions to be drawn as to the state of the control loop and thus to make a determination whether the system is supplied externally via a needle and a voltage source. This makes the observation of the internal regulated voltage itself superfluous, thus achieving independence of the evaluation of the internal regulated voltage change.

The inventive concept has the advantage that an unambiguous distinction between load changes caused by the system and actually induced spikes is facilitated. Thus the sensitivity of an inventive circuit for the detection of a spike attack is independent of the internal chip capacitance, the floor plan and the application.

In particular, it is to be noted that, depending on the circumstances, the inventive scheme may also be implemented in software. The implementation may be done on a digital storage medium, particularly a floppy disk or a CD with control signals that may be read out electronically, which may cooperate with a programmable computer system and/or microcontroller so that the corresponding method is executed. In general, the invention thus also consists in a computer program product with program code stored on a machine-readable carrier for performing the inventive method when the computer program product runs on a computer and/or microcontroller. In other words, the invention may thus be realized as a computer program with a program code for performing the method when the computer program runs on a computer and/or microcontroller.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for determining an interference with a regulated voltage provided as a controlled variable by a control loop, comprising:

a comparator configured to compare the controlled variable to a reference variable and to output a control variable at an output of the comparator depending on the comparison, wherein the control variable is used to control a control element of the control loop;

a monitor configured to monitor the control variable of the control loop; and a generator configured to generate a notification signal in addition to the control variable if the control variable or a change in time of the control variable is beyond a tolerance range around a normal value, to notify the interference, wherein the notification signal is not applied to the control element.

2. The device of claim 1, wherein the control loop comprises a regulation transistor, and the monitor monitors a control voltage of the regulation transistor as the control variable.

3. The device of claim 1, wherein the monitor is configured to monitor a lower cut-off frequency of the control variable.

4. The device of claim 1, wherein the control loop includes a charge pump for regulating a control voltage of a regulation transistor, wherein the control variable is configured to increase or decrease a voltage controlled oscillator frequency of the charge pump.

5. The device of claim 1, wherein the comparator comprises a differential amplifier with a first and a second output, wherein an UP signal may be provided as a first control variable at the first output to increase an output voltage of a charge pump, and a DOWN signal may be provided as a second control variable at the second output to reduce the output voltage of the charge pump, and wherein the monitor comprises a first and a second comparator to compare a frequency of the UP signal to a lower cut-off frequency with the first comparator, and to compare a frequency of the DOWN signal to a lower cut-off frequency with the second comparator.

6. The device of claim 5, wherein the first and the second comparator respectively comprise an output respectively coupled to the generator.

7. The device of claim 6, wherein the generator includes an OR gate with a first input, a second input and an output, wherein the first input is coupled to the output of the first comparator and the second input is coupled to the output of the second comparator and the output of the OR gate provides the notification signal if one of the two inputs indicates that the control variable or a change in time of the control variable is beyond the tolerance range around the normal value.

8. The device of claim 1, wherein the monitor is configured to digitally count a frequency of the control variable.

9. A method for determining an interference with a regulated voltage provided as a controlled variable by a control loop, comprising:

comparing, by a comparator, the controlled variable to a reference variable and outputting a control variable of the control loop depending on the comparison, wherein the control variable is used to control a control element of the control loop;

monitoring, by a monitor, the control variable of the control loop; and generating, by a generator, a notification signal in addition to the control variable if the control variable or a change in time of the control variable is beyond a tolerance range around a normal value, to notify the interference, wherein the notification signal is not applied to the control element.

10. The method of claim 9, wherein, in the step of monitoring the control variable, a control voltage of a regulation transistor is monitored as control variable.

11. The method of claim 9, wherein, in the step of monitoring the control variable or a change in time of the control variable, a frequency of a comparator output signal of a comparator with a comparator output is monitored.

12. The method of claim 9, wherein, in the step of monitoring the control variable or a change in time of the control variable, a voltage controlled oscillator frequency of a charge pump for regulating a control voltage of a regulation transistor is monitored.

13. The method of claim 9, wherein the control loop includes, for comparing the controlled variable to the reference variable, a differential amplifier with a first and a second output, wherein an UP signal may be provided as a first control variable at the first output to increase an output voltage of a charge pump, and a DOWN signal may be provided as a second control variable at the second output to reduce the output voltage of the charge pump, and wherein, in the step of monitoring the control variable or a change in time of the control variable, a frequency of the UP signal is compared to a lower cut-off frequency, and a frequency of the DOWN signal is compared to a lower cut-off frequency.

14. The method of claim 9, wherein, in the step of monitoring the control variable or a change in time of the control variable, a frequency of the control variable is digitally counted.

15. A computer program product with a program code stored on a digital storage medium for performing a method for determining an interference with a regulated voltage provided as a controlled variable by a control loop, when the computer program runs on a computer or microcontroller, the method comprising comparing the controlled variable to a reference variable and outputting a control variable depending on the comparison, wherein the control variable is used to control a control element of the control loop, monitoring the control variable of the control loop; and generating a notification signal in addition to the control variable if the control variable or a change in time of the control variable is beyond a tolerance range around a normal value, to notify the interference, wherein the notification signal is not applied to the control element.

* * * * *